United States Patent
Burgess et al.

(10) Patent No.: US 7,629,868 B2
(45) Date of Patent: Dec. 8, 2009

(54) CRYOGENIC COOLING OF SUPERCONDUCTING MAGNET SYSTEMS BELOW TEMPERATURE OF 4.2 K

(75) Inventors: Stephen Burgess, Abingdon (GB); Andrew John Varney, Oxford (GB); Darren Houlden, Abingdon (GB)

(73) Assignee: Magnex Scientific Limited, Yarnton, Oxford, Oxfordshire (GB)

( * ) Notice: Subject to any disclaimer, the term of this patent is extended or adjusted under 35 U.S.C. 154(b) by 444 days.

(21) Appl. No.: 10/589,039

(22) PCT Filed: Feb. 14, 2005

(86) PCT No.: PCT/GB2005/050013

§ 371 (c)(1),
(2), (4) Date: Aug. 10, 2006

(87) PCT Pub. No.: WO2005/081009

PCT Pub. Date: Sep. 1, 2005

(65) Prior Publication Data

US 2007/0182513 A1    Aug. 9, 2007

(30) Foreign Application Priority Data

Feb. 12, 2004    (GB) ................................. 0403113.4

(51) Int. Cl.
H01F 1/00    (2006.01)

(52) U.S. Cl. ........................................ 335/216; 335/296

(58) Field of Classification Search ................. 335/216, 335/296–299, 302–306
See application file for complete search history.

(56) References Cited

U.S. PATENT DOCUMENTS 3,839,689 A    10/1974    Hanley et al.

(Continued)

FOREIGN PATENT DOCUMENTS

JP    61260685 A    11/1986

(Continued)

OTHER PUBLICATIONS

Nagai H et al., "Development and Testing of superfluid-cooled 900 MHz NMR Magnet" Cryogenics, IPC Science and Technology Press Ltd, Guildford, GB, vol. 41, No. 9, Sep. 2001, pp. 623-630.

(Continued)

Primary Examiner—Elvin G Enad
Assistant Examiner—Bernard Rojas
(74) Attorney, Agent, or Firm—Bella Fishman

(57) ABSTRACT

A superconducting magnet system comprises a cryogenic vessel (1), a superconducting magnet (11) contained in an inner reservoir (16) within the vessel (1) to be cooled by liquid helium within the inner reservoir (16), and an outer reservoir (7) containing liquid helium and linked to the inner reservoir (16) by a feed tube (10) and a needle valve (9). In operation of the system current is supplied to the magnet (11) by a removable current lead (19) extending through the wall of the vessel (1) by way of a supply passage (17) in order to initiate superconducting current flow in the magnet. The supply of current to the magnet (11) is then stopped and the lead (19) is removed whilst the superconducting current flow persists in the magnet. After an extended period of superconducting current flow in the magnet (11) and without stopping such superconducting current flow, liquid helium at a temperature of about 4.2 K may be supplied to an upper part of the inner reservoir (16) above the magnet (11) from the outer reservoir (7) such that the magnet is still surrounded by liquid helium at a temperature of below 4.2 K. After a period of time the supply of liquid helium to the inner reservoir 16 is stopped, and the liquid helium in the inner reservoir (7) is cooled to a temperature below 4.2 K. Such a system is capable of being operated at very low temperatures down to below the lambda point, and of producing magnetic fields of high strengths and stability suitable for NMR spectroscopy.

20 Claims, 3 Drawing Sheets

U.S. PATENT DOCUMENTS

| | | | |
|---|---|---|---|
| 4,689,439 A | | 8/1987 | Sato et al. |
| 5,220,800 A | | 6/1993 | Mueller et al. |

FOREIGN PATENT DOCUMENTS

| | | | |
|---|---|---|---|
| JP | 63070405 A | * | 3/1988 |
| JP | 05187577 A | | 7/1993 |
| JP | 2001330328 A | | 11/2001 |

OTHER PUBLICATIONS

Williams, et al., "Magnet system of the 500 MHz NMR spectrometer at the Francis Bitter Nattional Magnet Laboratory: I. Designe and development of the magnet", Review of Scientific Instruments, vol. 52, No. 5, May 1981, pp. 649-656.

Celik, et al., "Helium II Level measuremnt techniques" Cryogenics, IPC Science and Technology Press Ltd, Guildford, GB, vol. 41, No. 5-6, May 2001, pp. 355-366.

* cited by examiner

CRYOGENIC COOLING OF SUPERCONDUCTING MAGNET SYSTEMS BELOW TEMPERATURE OF 4.2 K

This invention relates to cryogenic cooling of superconducting magnet systems.

Superconducting magnet systems, such as are used in nuclear magnetic resonance (NMR) spectroscopy and magnetic resonance imaging (MRI) and Fourier-transform mass spectroscopy (FTMS), incorporate a cryogenic vessel for containing the cryogenic fluid (normally liquid helium) to maintain the superconducting magnet at the required very low temperature of less than 4.2 K.

NMR spectroscopy requires not only high magnetic field strengths but also extremely high spatial homogeneity of the magnetic field that is generated, since resolution is limited by the absolute homogeneity of the magnetic field. A high degree of field stability is also required for the duration of the NMR measurement. The attainment of higher magnetic field strengths must be done in such a way that neither homogeneity nor stability are compromised. The latter is an important consideration in the method described in this application.

GB 2254409A discloses a NMR magnet system capable of generating very high magnetic field strengths by utilizing a superconducting magnet operated at a lower operating temperature than the normal temperature of liquid helium (4.2 K). To this end the NMR magnet system has a cryogenic vessel incorporating a first chamber containing the magnet and liquid helium at a temperature of less than 4.2 K, and a further chamber containing liquid helium at atmospheric pressure at a temperature of about 4.2 K. The first chamber is located below the further chamber within the vessel, and the first and further chambers are interconnected by a feed tube in such a way that the liquid helium in the first chamber is also essentially at atmospheric pressure, and so that liquid helium from the further chamber may be supplied to the first chamber at standard pressure and temperature and may then be cooled by pumping down through a choke to a non-equilibrium state.

In this arrangement the replenishment of liquid helium utilizes gravitational feed which can increase the overall height of the system and add a degree of complexity that can cause blockages and also an increase in helium consumption. Furthermore such an arrangement limits the extent to which the temperature of the liquid helium cooling the magnet can be dropped, due to cooling losses within the system. The arrangement relies critically on having the correct flow rate of liquid helium into the choke. If the flow rate is too high, liquid helium is drawn into the choke and expelled to the pumping line, resulting in waste of liquid and causing the pumps to struggle with the excess gas produced. The net effect is detrimental to achieving a low temperature. If, on the other hand, the flow rate is too low, then the choke runs out of liquid and the cooling is reduced. If the choke runs out of liquid, any gas leaks in the pumping line can result in blocking of the supply valve.

This whole prior method relies on a non-equilibrium state being set up, and it is essential that flow through the choke is maintained in order to maintain the system in this non-equilibrium state. If the valve were to be closed (or became blocked) then the helium in the magnet chamber would try to revert to its equilibrium conditions, the pressure would reduce and the temperature would increase, as the method relies on Joule-Thomson cooling of the liquid helium. It would therefore be difficult to maintain the magnet in the superconducting state over an extended period of time in the event that the pumps fail or there is a power outage.

The paper "Magnet System of the 500 MHz NMR Spectrometer of the Francis Bitter National Magnet Laboratory: I Design and Development of the Magnet" by J. E. C. Williams et al, Pp. 649-656, Rev. Sci. Instrum. 52(5), May 1981 also discloses a NMR magnet system capable of generating very high magnetic field strengths by utilizing a superconducting magnet operated at a lower operating temperature than the normal temperature of liquid helium (4.2 K). In this case the NMR magnet system has a cryogenic vessel incorporating a first chamber containing the magnet and liquid helium at a temperature of less than 4.2 K, and a further chamber surrounding the first chamber and containing liquid helium at atmospheric pressure at a temperature of about 4.2 K. The first and further chambers are interconnected by a feed tube containing a needle valve through which liquid helium is supplied from the further chamber and flash evaporated over the magnet in the first chamber in order to cool the magnet. This method of cooling relies on the liquid helium being supplied through the needle valve continuously, and accordingly the method is relatively inefficient and presents problems in terms of maintaining the magnet in a superconducting state over an extended period of time in the event that the pumps fail or there is a power outage. The helium consumption is ~200 ml/hour which is a high figure for such a small magnet and cryostat.

It is an object of the invention to provide a method of cryogenically cooling a superconducting magnet down to very low temperatures below 2.5 K, and preferably below the lambda point (2.17 K), in an efficient and reliable manner, so as to enable magnetic fields of high strengths and excellent field stability to be produced.

According to one aspect of the present invention there is provided a method of cryogenically cooling a superconducting magnet surrounded by liquid helium at a temperature of below 4.2 K within an inner chamber of a cryogenic vessel, the method comprising:

supplying current to the magnet by way of a supply passage extending through the wall of the vessel in order to initiate superconducting current flow in the magnet, stopping the supply of current to the magnet whilst the superconducting current flow persists in the magnet, after an extended period of superconducting current flow in the magnet and without stopping such superconducting current flow, supplying liquid helium at a temperature of about 4.2 K to an upper part of the inner chamber above the magnet such that the magnet is still surrounded by liquid helium at a temperature of below 4.2 K, stopping the supply of liquid helium to the inner chamber, and cooling the liquid helium in the upper part of the inner chamber to a temperature of below 4.2 K.

Such a method of cryogenically cooling a superconducting magnet is capable of effecting cooling down to very low temperatures, enabling high homogeneity, high stability magnets suitable for NMR spectroscopy to be produced at higher magnetic field strengths. The magnet may be cooled by the liquid helium within the inner chamber down to a temperature of below 2.5 K, and preferably below the lambda point (2.17 K). Furthermore, since the method involves supplying liquid helium to an upper part of the inner chamber above the magnet over only a limited period of time (and only relatively infrequently in the operation of the cryogenic vessel), it follows that the maintenance of the magnet at the required very low temperature does not rely on the continual supply of liquid helium to the inner chamber, so that it will be possible for the magnet to be maintained at the required temperature for an extended period of time in the event of pump failure or a power outage. In preferred embodiments of the invention the overall height of the cryogenic system is decreased and the complexity of the system is simplified as compared with known systems, with consequent decreases in blockages and in helium consumption.

The invention may be applied to a horizontal cryostat in which the magnet is annular and is disposed with its axis horizontal within a horizontal cryogenic vessel. In such an application the liquid helium at a temperature of about 4.2 K is preferably supplied to the upper part of the inner chamber from a source of liquid helium that is external to the cryogenic vessel.

The invention may alternatively be applied to a vertical cryostat in which the magnet is annular and is disposed with its axis vertical within a vertical cryogenic vessel. In this application the liquid helium at a temperature of about 4.2 K is preferably supplied to the upper part of the inner chamber from an outer chamber surrounding the inner chamber and contained within the cryogenic vessel. The inner chamber is thereby cooled by liquid helium within the outer chamber, and the inner chamber may be connected to the outer chamber by an interconnecting feed tube for the purpose of occasionally replenishing the inner chamber with liquid helium from the outer chamber. The feed tube conveniently incorporates a valve for turning the flow of liquid helium to the inner chamber on or off.

In one embodiment of the invention the liquid helium at a temperature of below 4.2 K is supplied to the inner chamber by way of a needle valve having a removable actuating shaft, and the actuating shaft is removed from the needle valve after the supply of liquid helium to the inner chamber has stopped, in order to limit heat conduction during further operation.

In one embodiment of the invention the current is supplied to the magnet by way of a removable current lead having a connector part at one end adapted (i) to be connected to a connector part provided on the magnet internally of the inner chamber in order to supply current from an external current source to the magnet by way of the lead extending through the supply passage, and (ii) to be subsequently detachable from the connector part to permit withdrawal of the lead from the supply passage so as to limit heat conduction along the supply passage during further operation.

Preferably the inner chamber is vented with helium gas without warming the liquid helium within the inner chamber to any substantial extent to permit the lead to be withdrawn from the supply passage.

According to another aspect of the present invention there is provided a superconducting magnet system comprising:

a cryogenic vessel, a superconducting magnet contained in an inner chamber within the vessel to be cooled by liquid helium at a temperature of below 4.2 K within the inner chamber, current supply means for supplying current to the magnet by way of a supply passage extending through the wall of the vessel in order to initiate superconducting current flow in the magnet, and for subsequently stopping the supply of current to the magnet whilst the superconducting current flow persists in the magnet, liquid helium supply means for supplying, after an extended period of superconducting current flow in the magnet and without stopping such superconducting current flow, liquid helium at a temperature of about 4.2 K to an upper part of the inner chamber above the magnet such that the magnet is still surrounded by liquid helium at a temperature of below 4.2 K, and for subsequently stopping the supply of liquid helium to the inner chamber, and cooling means for cooling the liquid helium in the upper part of the inner chamber to a temperature of below 4.2 K.

In order that the invention may be more fully understood, a preferred embodiment of superconducting magnet system in accordance with the invention will now be described, by way of example, with reference to the accompanying drawings, in which.

Figure 1:
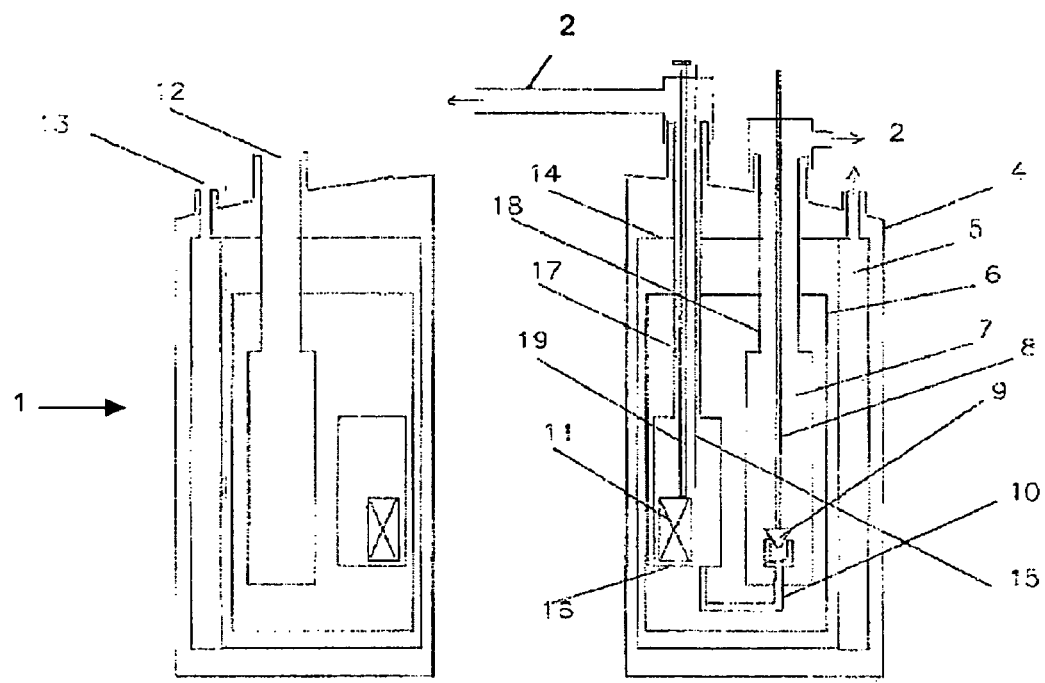
FIG. 1 is an axial section through the embodiment.

The superconducting magnet system of FIG. 1 of the drawings is intended for high field NMR spectroscopy. However it will be well understood that similar systems may be used in other applications.

Referring to FIG. 1 the superconducting magnet system comprises an annular cryogenic vessel 1 (shown in axial section so that only two opposite parts angularly offset by 120 degrees relative to one another can be seen in the figure) having an outer vacuum container 4 and containing a superconducting magnet 11 comprising magnet coils (not shown in detail). The magnet 11 is housed within an inner chamber inside a stainless steel annular reservoir 16 for containing liquid helium boiling at reduced pressure at about 2.2K, the magnet 11 and the reservoir 16 being suspended from the top wall of an outer vacuum container 4 by means of high tensile GRP rods (not shown). An outer chamber for containing liquid helium boiling at normal atmospheric pressure at about 4.2K is defined within a secondary stainless steel annular reservoir 7 surrounding the reservoir 16. Furthermore a gas-cooled solid shield 6 made of high conductivity aluminium surrounds the secondary reservoir 7 and is cooled mainly by cold evaporating helium gas from the reservoirs 16 and 7. Finally the gas-cooled shield 6 is surrounded by a liquid nitrogen reservoir 5 for containing liquid nitrogen ($LN_2$) at normal atmospheric pressure at about 77K and a further gas-cooled radiation shield 14.

The rods supporting the magnet 11 and the reservoir 16 are thermally linked to the various cold radiation shields (that is the gas-cooled shield 6 and the other shields forming the reservoir walls etc) in order to reduce conducted heat input. Furthermore the reservoir 16 is provided with a single neck 17 extending through the top wall of the outer vacuum container 4 and defining a supply passage containing the current lead 19 to the magnet 11 as well as other electrical connecting leads, including the lead to a liquid helium level monitor 15 within the inner chamber. The neck 17 also provides a passage for evaporating gas streams providing thermal links to the radiation shields. In the case of the gas-cooled shield 6 the cold gas reduces the temperature of the shield and thereby improves its efficiency.

The secondary reservoir 7 is suspended from the top wall of the outer vacuum container 4 by means of three necks 18 extending through the top wall (two of these necks being visible in the figure). The secondary reservoir 7 can easily be filled with liquid helium by way of a fill port (not shown) in one of the necks 18. The necks 18 are also thermally linked to the radiation shields providing further cooling by means of the evaporating gas streams within the necks 18. The gas-cooled shield 6 is not as heavy as the reservoirs 16 and 7 and is easily supported from the necks 17 and 18. The liquid nitrogen reservoir 5 is provided with three necks 13 by means of which it is suspended from the top wall of the outer vacuum container 4, the necks 13 providing exhausts for the cold LN2 gas.

On initial start-up of the system the reservoirs 16 and 7 contain liquid helium boiling at 4.2 K at atmospheric pressure. However, in order to enhance the properties of the superconducting wire from which the magnet coils are wound, the temperature of the liquid helium in the inner chamber within the reservoir 16 is reduced to about 2.2 K by reducing the pressure above it by means of a rotary pump (not shown) connected to an exhaust outlet 2 connected to the neck 17. As well as acting as a cold radiation shield, the secondary reservoir 7 is used to replenish the reservoir 16 with liquid helium. At a predetermined low level of the helium within the reservoir 16 as indicated by the level monitor 15, a needle valve 9 within a feed tube 10 interconnecting the reservoirs 16 and 7 may be opened by the actuating shaft 8 so as to permit helium to flaw from the secondary reservoir 7 to the reservoir 16 by virtue of the higher pressure in the reservoir 7.

During such replenishing helium flow, when the liquid helium in the reservoir 16 has reached a predetermined high level in the reservoir 16 as determined by the level monitor 15, the needle valve 9 is closed so as to prevent any further helium flow along the feed tube 10 from the reservoir 7 to the reservoir 16. The needle valve 9 may be operated manually or under the control of an automatic control circuit receiving inputs from the level detector etc, and may be operated so as to place the valve in an open, closed or partially closed condition. The supply of helium from the reservoir 7 to the reservoir 16 takes place such that the fresh helium at a temperature of about 4.2K is supplied to an upper part of the reservoir 16 above the magnet and does not mix significantly with the helium at a temperature of 2.2 K surrounding the magnet 11. During and after the supply of the fresh helium to the reservoir 16, the fresh helium will cool down to 2.2 K because the low pressure is restored by the rotary pump.

In addition to supplying liquid helium to replenish the reservoir 16, the secondary reservoir 7 acts as a thermal shield to the reservoir 16 so as to reduce the evaporation of helium from the reservoir 16 and facilitate the attainment of sub-lambda temperatures. The large amount of cold or superfluid helium present, together with the low heat load into this, ensures that, in the event of a failure of the pumping system, the temperature of the magnet will not rise to a critical level for a very long time. Also the secondary reservoir 7 increases the time between liquid refills under normal operation which, in turn, minimises disruption to the NMR experiment.

The simplicity of construction ensures flexibility of attainable temperatures all the way down to 1.8 K and even lower, as well as allowing the outgoing cold helium gas to cool the thermal radiation shields in the most natural way, thus reducing heat input to the reservoirs 7 and 16. Since the secondary reservoir 7 contains liquid helium at normal atmospheric pressure, it is easily refilled with liquid helium from an external source in conventional manner.

The inner reservoir 16 operates normally in isolation from the reservoir 7. It can be occasionally (every few months) filled (taking just a few hours) from the reservoir 7 using a needle valve 9 that is operated to be either closed (normal operation) or open (occasional manual filling operation). Filling is achieved by opening of the needle valve 9 and by letting helium flow from the reservoir 7 to the inner reservoir 16, and no fine control of the needle valve 9 is required. The existing helium in the inner reservoir 16 (and the magnet 11 itself) remains at about 2.2K, in temporary non-equilibrium conditions, while the added helium at about 4.2K being less dense floats on top of the existing helium. After refilling the whole of the inner reservoir 16 is sealed off and pumped to its original low pressure by drawing off helium vapour from the top of the reservoir and expelling it from the cryostat by way of the exhaust outlet 2, and the magnet 11 remains at its low temperature of 2.2K throughout this operation.

In the event of the needle valve 9 becoming blocked by any contaminants in the reservoir 7, the inner reservoir 16 can be filled from an external liquid helium dewar using a standard helium transfer siphon. This can be done by letting the pressure of the inner reservoir 16 rise to 1 bar and by transferring helium to the inner reservoir 16 in the normal way. The existing helium (and the magnet 11 itself) remains at about 2.2K, in temporary non-equilibrium conditions, while the added helium at about 4.2K being less dense floats on top of the existing helium. After refilling the whole of the inner reservoir 16 is sealed off and pumped to its original low pressure and temperature by means of the rotary pump, and the magnet 11 remains at its low temperature of 2.2K throughout this operation. Preferably a second needle valve with its own stem (not shown) is provided in parallel with the first needle valve 9 in case one of the valves becomes blocked.

Whichever method is used to fill the inner reservoir 16, the fresh helium at about 4.2K initially floats on top of the existing helium that remains at an almost constant temperature of about 2.2K. The inner reservoir 16 can be refilled with minimal disturbance to the temperature of the original liquid helium or the magnet 11. This constancy of magnet temperature is important to the long term operation and field stability of the magnet.

In the method of the invention, cooling by drawing off vapour from the top of the inner reservoir 16 is used to reduce the pressure of the vapour above the liquid helium in the inner reservoir 16. In equilibrium, the boiling temperature of the liquid helium is dependent on the pressure of the vapour above it. If the pressure above the liquid is reduced, the boiling point is reduced. Where the liquid is already boiling (as in the case of liquid helium in a cryostat) because of heat supplied, then the temperature must fall. Energy must be taken out of the liquid to cause the temperature fall and this is effected by the release of a lot of vapour resulting in a reduction of the mass of liquid. Once the pressure has reached a set point, corresponding to a set helium liquid boiling temperature, that temperature is maintained by maintaining the vapour pressure above the liquid. The energy flowing into the system due to heat conduction, radiation, etc. must be balanced by the energy taken out of the system through the release of vapour to remain in equilibrium.

During the periodic top-up of the helium in the inner reservoir 16, the liquid in the inner reservoir 16 is already at a reduced temperature. Because of the low heat load and relatively large mass of the helium already in the inner reservoir 16 compared to the liquid helium at about 4.2K being supplied to the reservoir, as long as the helium does not mix significantly, the existing helium at about 2.2K does not warm up very quickly. Since the density of the helium at about 4.2K is lower than that of the helium at about 2.2K, it does not mix significantly if it is supplied on top of the helium at about 2.2K. Hence there is sufficient time for the helium at about 2.2K to be supplied before the existing helium at about 4.2K in the inner reservoir 16 has warmed up significantly. Once this top-up helium has been supplied and the rotary pump is in operation, it will cool as the helium vapour is drawn off from it in the same way as described above. Since the main bulk of the helium in the inner reservoir 16 has not warmed significantly, there is very little (if any) cooling required to reduce this back to the original temperature.

Figure 2:
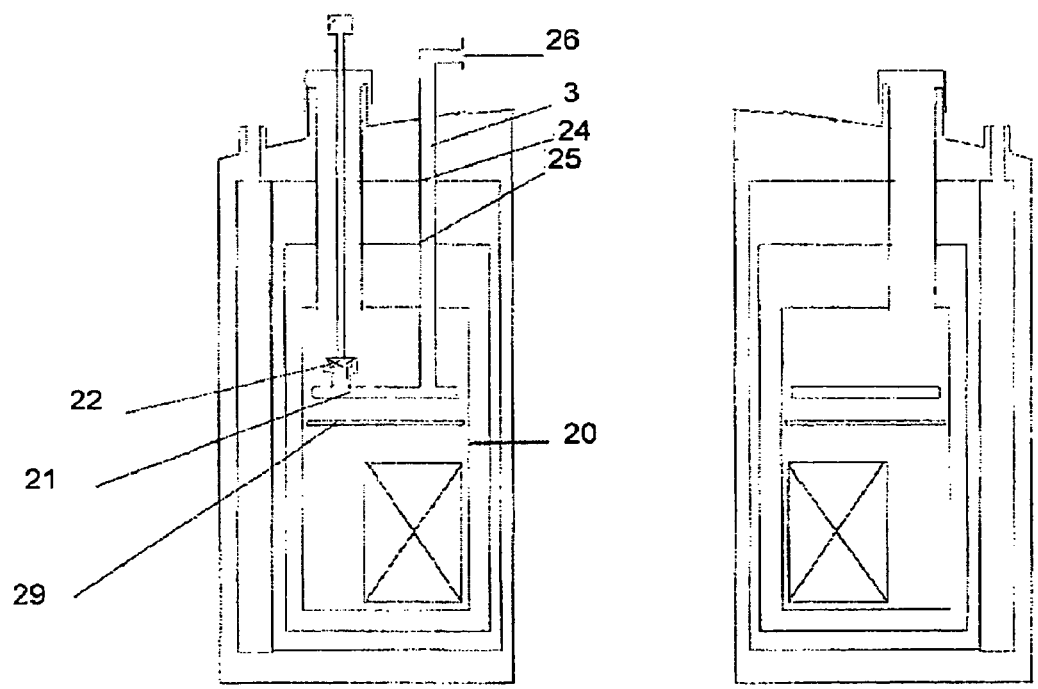
FIG. 2 is an axial section through a known lambda point refrigeration system.

In order to stress the difference between such an arrangement and a known lambda-point refrigerator, reference will now be made to FIG. 2 which is an axial section through such a known lambda-point refrigerator. In this case the magnet 20 is accommodated within a helium reservoir 21 which is itself surrounded by a $LN_2$ shield 25 and gas-cooled radiation shields 24. The liquid helium is drawn into a refrigerating element 21 by a rotary pump connected to the exhaust outlet 26 by a tube 3, a needle valve 22 being provided to throttle the liquid flow to allow low pressure in the refrigerating element 21 and hence a lower temperature for the boiling helium. The surrounding liquid in the reservoir 20 is cooled by conduction and falls to the bottom of the reservoir 20 due to its higher density. A thermal barrier 29 is provided to help prevent conduction of helium in the upper part of the reservoir 20 at 4.2 K to the lower part of the reservoir 20 at lower temperature.

Such a known lambda-point refrigerator suffers from a number of disadvantages in that devices are necessary to prevent a dangerous build up of pressure should the magnet quench, and it is difficult to attain a temperature below 2 K using such an arrangement. Furthermore special means are required to ensure correct setting of the needle valve, and moreover the needle valve is prone to blocking, especially if the refrigerator runs out of liquid.

Both such a lambda-point refrigerator and the prior arrangement of GB 2254409A rely on replenishment of liquid helium by gravitational feed from an upper chamber, and these approaches increase the overall height of the system and add a degree of complexity which can cause blockages and also an increase in helium consumption. The rate at which liquid is supplied to the choke (or lambda-point refrigerator) in the prior arrangement is critical. If it is too high the helium is wasted. If it is too low the refrigerator or choke runs out of liquid and any gas leaks in the pumping line can cause blockages. Even if the flow is set perfectly there are still two phases of liquid present at different temperatures and the heat flow from warm to cold liquid cannot be eliminated, but can only be reduced by the provision of a complex thermal barrier.

Reverting to the embodiment of the invention described above with reference to FIG. 1, the magnet 11 may be initially energised with current by way of a removable current lead 19 extending along the passage within the neck 17, the current lead 19 being removed completely from the neck 17 once the magnet 11 has been fully energised such that superconducting current flow persists in the magnet coils in spite of the disconnection of the lead 19. The consequential fall in temperature stabilises the magnetic field resulting in very low field decay, as is essential for NMR experiments.

Figure 3:
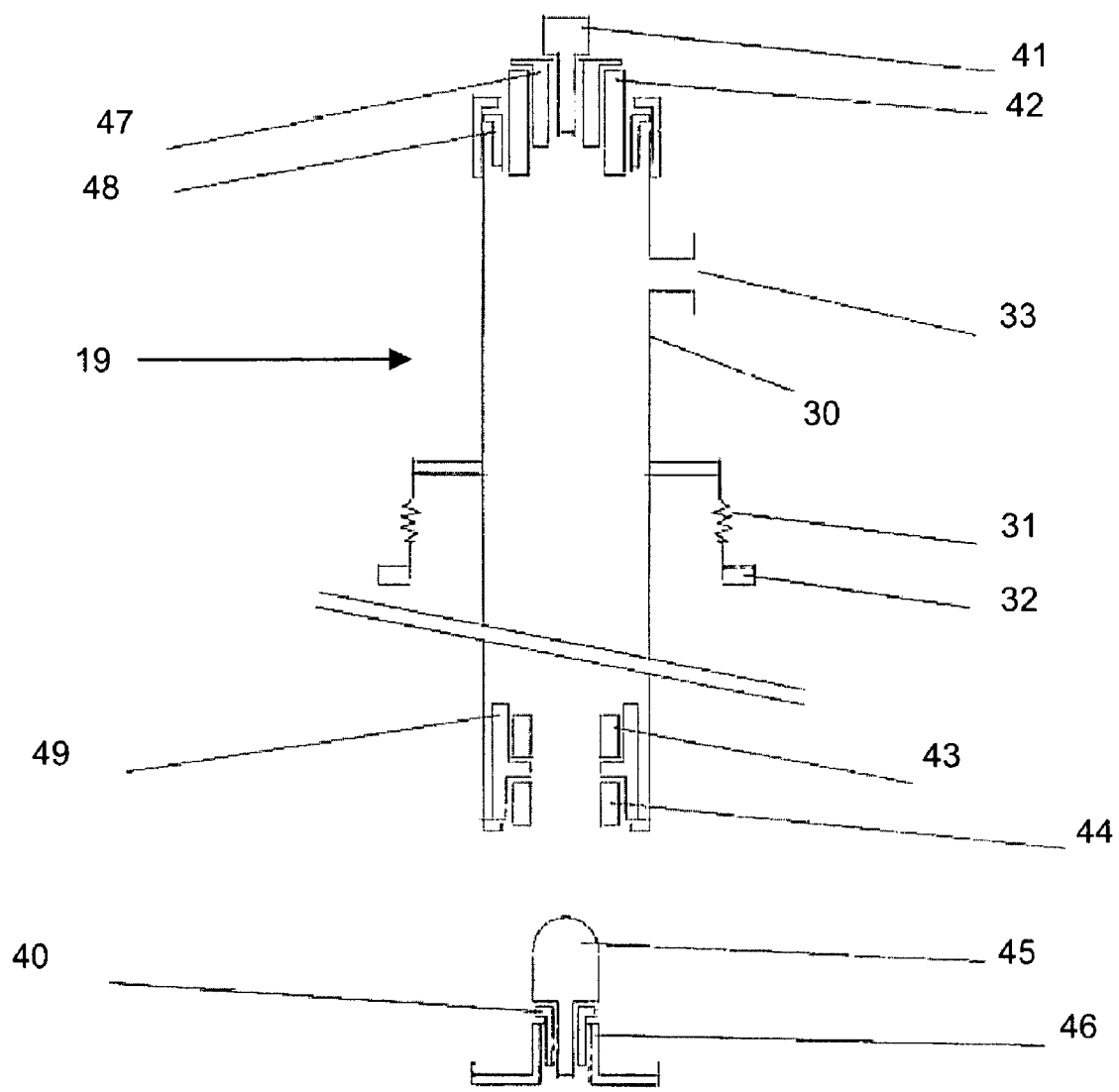
FIG. 3 is an axial section through a removable current lead of the embodiment of FIG. 1.

FIG. 3 diagrammatically shows the removable current lead 19 that comprises a shaft 30 extending through the neck 17 and connected to the top of the neck 17 by a leak-tight sealing flange 32 and flexible bellows 31. In additional the shaft 30 is provided with an exhaust outlet 33 for the exhaust of cold helium gas which enters at the bottom of the shaft 30 through vent holes (not shown). At the top of the lead 19 are positive and negative current terminals 41 and 42 surrounded by insulating bushes 47 and 48, a connecting cable (not shown) being provided for fitting to the top of the lead 19 to establish a connection to an external power supply for energising the magnet. The connections from the top of the lead 19 to the external power supply are made by way of two bolted on solid copper clamps fixed to the terminals 41 and 42. The power supply is located on a bench approximately 12 meters away from the magnet and outside the dangerously high stray field from the magnet. Substantial copper cables carry the current from the power supply to the magnet.

The bottom of the lead 19 is provided internally with positive and negative current connections 43 and 44 surrounded by an insulating bush 49 for the purpose of contacting positive and negative current connections 45 and 46 separated by an insulating bush 40 on a contact part of the magnet when the current lead 19, with the power supply connecting cable attached, is pushed downwardly within the neck 17 (possibly with a slight twisting motion) so that the lower part of the shaft 30 engages over the connector part of the magnet and establishes an electrical connection therewith. The connections 43 and 44 may be of a known type and incorporate a series of circumferentially spaced springs for biasing the connections into electrical contact with the connections 45 and 46 on the magnet when the lower part of the shaft 30 engages over the contact part. The positive and negative current connections 43 and 44 at the bottom of the lead 19 are connected to the positive and negative current terminals 41 and 42 at the top of the lead 19 by way of coaxial brass conductors (not specifically shown in the figure). At various stages of magnet operation the temperature of the lead 19 can change, causing thermal expansion and contraction and these can be accommodated by the flexible bellows 11.

During energisation of the magnet with current supplied along the lead 19, the reservoir 16 within which the magnet is accommodated is full of super-cooled liquid helium at low pressure. However, when the magnet has been suitably energised, it is preferable that the lead 19 is removed from the neck 17 to reduce the heat load on to the reservoir 16 and hence reduce the helium consumption in normal operation. In some applications the removal of the lead 19 is essential so as to allow sub-lambda temperatures to be achieved and hence a stable magnetic field. In order to permit the lead 19 to be removed, and also to enable the lead 19 to be connected to the magnet, the reservoir 16 must first be vented with helium gas and brought up to atmospheric pressure. To this end a gas bottle containing helium gas is connected by means of a "T" fitting and a one-way valve to the pumping line linking the pump to the exhaust outlet 2. The pump is then switched off and the valve opened so that helium gas flows from the gas bottle into the space above the magnet, until atmospheric pressure is achieved. The gas is allowed to flow for a few more minutes through the valve in the pumping line before the lead 19 is inserted or removed.

It has been determined empirically that this can be done without any significant warming of the supercold liquid helium in the reservoir 16 occurring over a period of several hours. This therefore provides sufficient time for detachment of the lead 19, with the power supply connecting cable attached, from the magnet by pulling hard on the lead 19 (possibly accompanied by a twisting motion) so that the lower part of the shaft 30 becomes detached from the connector part. The lead 19 can then be completely withdrawn from the neck 17, with the top of the neck 17 being subsequently capped to limit heat conduction along the neck 17. The cap used for this purpose is simply a blank flange with an outer edge having a similar profile to the flange 32 that it replaces.

Figure 4:
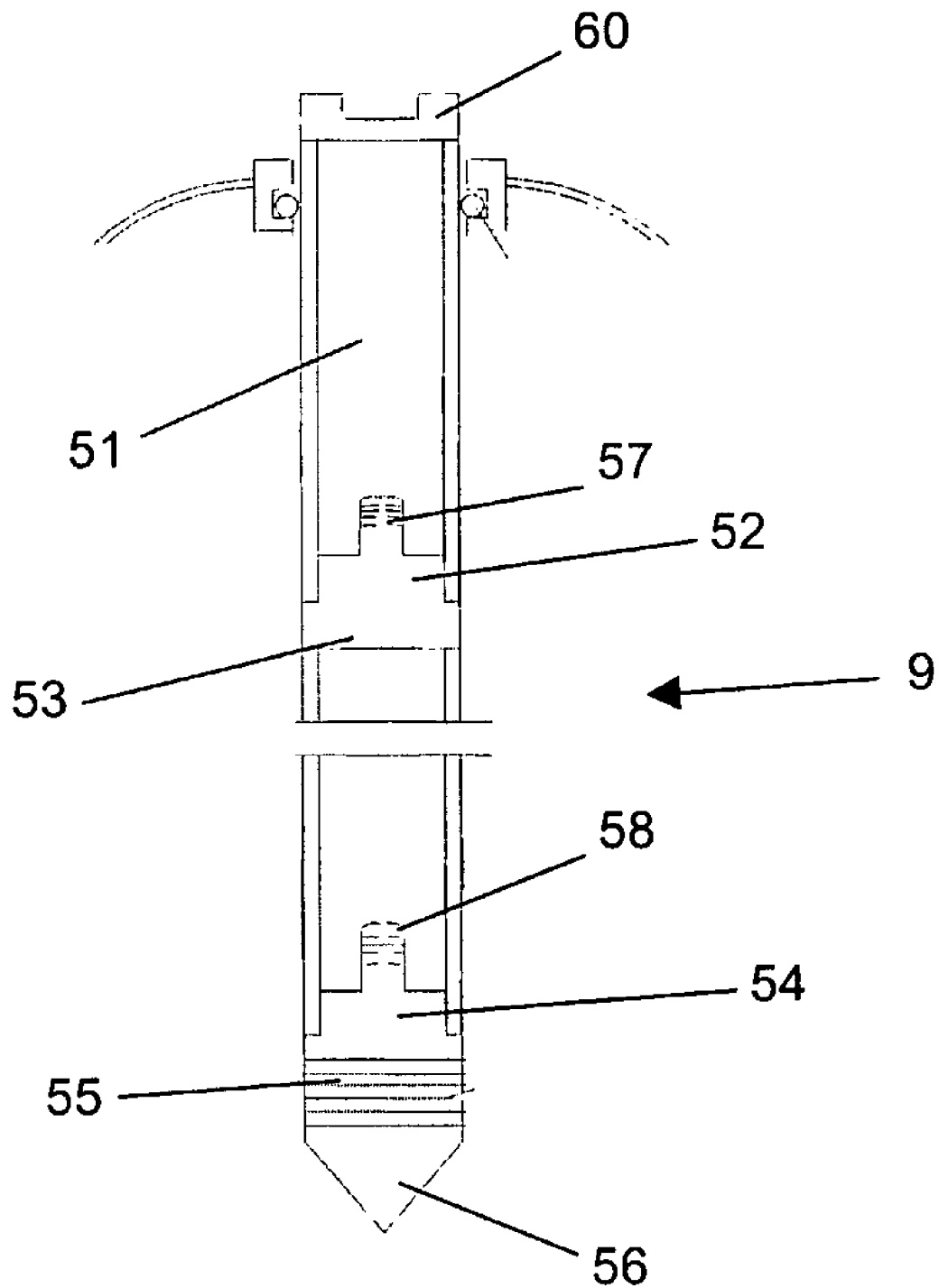
FIG. 4 is an axial section through a removable needle valve assembly of the embodiment of FIG. 1.

In a development of the invention the needle valve 9 is provided with an actuating shaft that is removable from the needle valve after the supply of liquid helium to the inner reservoir 16 has stopped, in order to limit heat conduction during further operation. In this case, as shown diagrammatically in FIG. 4, the needle valve 9 consists of three demountable sections, namely an upper section 51 that can be removed by simply lifting clear of a loose hexagonal connection 52, a middle, flexible section 53 that can be removed by simply lifting clear of a loose hexagonal connection 54, and a lower section 55, incorporating the valve member 56, that can also be removed with an insertion tool.(not shown). It is necessary to use the insertion tool having a female thread at its tip to engage a male threaded portion 57 of the middle section 53 for lifting of the section 53 clear of the hexagonal connection 54. Furthermore it is necessary to use the insertion tool to engage a male threaded portion 58 of the lower section 55 if it is required to remove the valve member for maintenance. The provision of a left hand thread on the insertion tool ensures that the needle valve (which is held in place by a right hand thread) is loosened fully before removal.

Under normal operation the needle valve 9 can be opened and closed by an operating tool (not shown) engaging a hexagonal socket 60 at the top of the actuating shaft of the valve. The upper section 51 of the valve can be removed after use in order to minimise loss of liquid helium through conduction of heat down the shaft. Occasionally (e.g. for free access) it may be necessary to remove the middle section 53 without removing the valve member (lower section 55) as described above. Finally the valve member itself may be removed for servicing.

It is important to appreciate that the reservoir 16 containing the magnet 11 is completely isolated from the reservoir 7 in normal operation and for the majority of the time. The system runs with the reservoir 7 containing liquid helium at about 4.2K at the normal atmospheric boiling point of liquid helium and with the reservoir 16 containing liquid helium at about 2.2K at the boiling point of liquid helium at reduced pressure, typically 60 mbar. The reservoir 16 is only filled very occasionally, typically about once every six months, by opening the needle valve 9 and leaving it open for a certain period of time, typically overnight for a few hours, before fully closing the valve again. Then, for about the next six months, the needle valve 9 is fully closed off with no flow through the valve occurring, and the helium in the reservoir 16 very slowly evaporates. This lack of flow during normal operation is a fundamental difference between the system of the invention and the prior art systems that require steady controlled flow from one chamber to another.

The following advantages are achieved in use of the embodiment of FIG. 1:

1. Closing of the needle valve 9 and stopping of the flow of helium very considerably reduces the normal operating heat leakage to the inner reservoir 16 as compared with a prior art continuously filling system. This means that, if the pumps fail, the temperature of the inner reservoir 16 increases very slowly indeed, typically only a few milliK per day.
2. This slow increase in the temperature of the inner reservoir 16 gives a lot of time (i.e. weeks) before any temperature rise becomes critical to the operation of the magnet. It allows plenty of time for the pumps to be repaired or serviced (in the event of a fault or power outage) before the magnet warms to the point where it starts to drift or even eventually to the point where it quenches. The only necessary action in the event of any problem with the pumps is that an automatic valve shuts off the pumps and isolates the inner reservoir 16. For prior art systems pump failure is a real problem that requires immediate intervention because of the imminent danger of warming.
3. No flow control or needle valve position control is needed. The needle valve 9 is either manually opened (for occasional refilling) or manually shut (for normal operation). Filling is an occasional manual operation that gives considerable simplification of design, manufacture and operation. The chances of a blockage developing (as will tend to occur with a partly open but controlled and throttled needle valve) are therefore virtually zero.
4. Because there is no active control of the needle valve 9, the needle valve stem may be removed for most of the time. Removal of the needle valve stem reduces heat leaks into the outer reservoir 7 and reduces running costs. A needle valve stem only needs to be re-inserted during the occasional helium fills.
5. With this zero flow concept, the design could be extended to a case where the inner reservoir 16 could be operated in isolation, i.e. not pumped. It would only need to be pumped after it had been refilled with helium and until the correct operating temperature had been reached. At that point it could be valved off and isolated. For a period of many months the inner reservoir 16 would hardly warm as the heat leakage could be made small compared to its heat capacity or thermal mass. The pumps could also be switched off during normal operation (except when filling) to reduce noise and vibrations.

In an alternative, non-illustrated embodiment of the invention a similar arrangement is applied to a cryostat for a large horizontal pumped magnet in which the magnet is annular and is disposed with its axis horizontal within an annular cryogenic vessel also with its axis horizontal. The cryogenic vessel includes an inner reservoir for containing liquid helium boiling at reduced pressure at about 2.2K, the magnet and the reservoir being suspended by means of high tensile GRP supports. Furthermore the inner reservoir is surrounded by radiation shields including either a liquid nitrogen reservoir for containing liquid nitrogen (LN2) boiling at normal atmospheric pressure at about 77K or shields cooled by an external cryocooler. However, in this case, there is no outer reservoir for containing liquid helium boiling at normal atmospheric pressure at about 4.2K (corresponding to the reservoir 7 in the first embodiment). Instead the liquid helium at a temperature of about 4.2 K is preferably supplied to the upper part of the inner reservoir from a source of liquid helium that is external to the cryogenic vessel, for example from a separate external supply dewar. A filling control needle valve may be provided as part of a helium siphon provided for occasional supply of helium to the reservoir from the external supply dewar.

The actual operation of the two types of cryostat (that is the above-described cryostat for a large horizontal pumped magnet having a single helium reservoir, and the originally described dual reservoir vertical cryostat arrangement) is slightly different in this procedure. For the dual reservoir (vertical) system, it is not necessary, or indeed desirable, to stop the pumps (indeed the pumping capacity is usually increased by opening a valve more fully and switching on a back-up pump so that during the operation the helium at about 4.2K supplied to the inner reservoir is continuously cooled as it sits on top of the existing helium). For the single reservoir (horizontal) system, the procedure that is usually used is to stop the pump(s), to let up the magnet to atmospheric pressure and to top up with helium at about 4.2K before resealing the reservoir and restarting the pumps. In either case, the key point is that the top-up is done after an extended period during which the helium in the inner reservoir has not been replenished (rather than the replenishment being done continuously as in the prior arrangements previously described).

The invention claimed is:

1. A method of maintaining cryogenic cooling of a superconducting magnet surrounded by liquid helium at a temperature of below 4.2 K within an inner chamber of a cryogenic vessel, the method comprising:
    supplying current to the magnet by way of a removable current lead extending through a supply passage passing through the wall of the vessel in order to initiate superconducting current flow in the magnet;
    stopping the supply of current to the magnet whilst the superconducting current flow persists in the magnet;
    withdrawing the current lead from the supply passage;

after an extended period of superconducting current flow in the magnet without stopping such superconducting current flow, supplying by way of a valve, liquid helium at a temperature of about 4.2 K to an upper part of the inner chamber above the magnet such that the magnet is still surrounded by liquid helium at a temperature of below 4.2 K;

stopping the supply of liquid helium to the inner chamber by closing the valve; and cooling the liquid helium in the upper part of the inner chamber to a temperature of below 4.2 K by reducing the pressure in the upper part of the inner chamber by pumping whilst the valve remains closed, whereby the flow of liquid helium from the outer chamber to the upper part of the inner chamber occurs as a result of the reduced pressure upon opening of said valve.

2. The method according to claim 1, wherein the magnet is cooled by the liquid helium within the inner chamber to a temperature of below 2.5 K.

3. The method according to claim 2, wherein the magnet is cooled by the liquid helium within the inner chamber down to a temperature below the lambda point (2.17 K).

4. The method according to claim 1, wherein the valve has a removable actuating shaft, and the actuating shaft is removed from the valve after the supply of liquid helium to the inner chamber has stopped, in order to limit heat conduction during farther operation.

5. The method according to claim 3, wherein the current is supplied to the magnet by way of the removable current lead having a connector part at one end adapted to be connected to a connector part provided on the magnet internally of the inner chamber in order to supply current from an external current source to the magnet by way of the lead extending through the supply passage, and to be subsequently detachable from the connector part to permit withdrawal of the lead from the supply passage so as to limit heat conduction along the supply passage during further operation.

6. The method according to claim 5, wherein the inner chamber is vented with helium gas without warning the liquid helium within the inner chamber to any substantial extent to permit the lead to be withdrawn from the supply passage.

7. The method according to claim 6, wherein the level of the liquid helium in the inner chamber is monitored during operation so as to provide an indication of the need to supply liquid helium at a temperature of about 4.2 K to the upper part of the inner chamber when the level of the liquid helium in the inner chamber has fallen below a predetermined level.

8. The method according to claim 7, wherein the magnet is annular and is disposed with its axis vertical within a vertical cryogenic vessel.

9. A superconducting magnet system comprising:
a cryogenic vessel;
a superconducting magnet contained in an inner chamber within the vessel to be cooled by liquid helium at a temperature of below 4.2 K within the inner chamber;
an outer chamber surrounding the inner chamber, the outer chamber holding a supply of liquid helium at a temperature of about 4.2 K,
a removable current lead, which supplies current to the magnet via a supply passage extending through the wall of the vessel in order to initiate superconducting current flow in the magnet, and subsequently stopping the supply of current to the magnet whilst the superconducting current flow persists in the magnet and the current lead is withdrawn from the supply passage;
a valve which supplies, after as extended period of superconducting current flow in the magnet and without stopping the superconducting current flow, liquid helium at a temperature of about 4.2 K from the outer chamber to an upper part of the inner chamber above the magnet where the magnet is surrounded by liquid helium at a temperature of below 4.2 K, and subsequently stops the supply of liquid helium to the inner chamber by closing the valve; and cooling means, which cools the liquid helium in the upper part of the inner chamber to a temperature of below 4.2 K by reducing the pressure in the upper part of the inner chamber by pumping whilst the valve remains closed, whereby the flow of liquid helium from the outer chamber to the upper part of the inner chamber occurs as a result of the reduced pressure upon opening of said valve.

10. The system according to claim 9, wherein the valve has a removable actuating shaft, which is removable from the valve after the supply of liquid helium to the inner chamber has stopped in order to limit heat conduction during further operation.

11. The system according to claim 9, wherein
the removable current lead has a connector part placed at one end of the lead, and the magnet has a connector part placed within the inner chamber in order to supply current from an external current source to the magnet via the lead through the supply passage to initiate superconducting current flow in the magnet when the connector parts are connected, and with the superconducting current flow persisting in the magnet, to permit withdrawal of the lead from the supply passage when the connector parts are separated so as to limit heat conduction along the supply passage during further operation of the system.

12. The system according to claim 11, further comprising venting means, which vents the inner chamber with helium gas without warming the liquid helium within the inner chamber to any substantial extent to permit the lead to be withdrawn from the supply passage.

13. The system according to claim 12, further comprising monitoring means, which monitors the level of the liquid helium in the inner chamber during operation and provides an indication of the need to supply liquid helium at a temperature of about 4.2 K to the upper part of the inner chamber when the level of the liquid helium in the inner chamber has fallen below a predetermined level.

14. The system according to claim 13, wherein the magnet is annular and is disposed with its axis horizontal within a horizontal cryogenic vessel.

15. The system according to claim 14, wherein the valve is connected to a source of liquid helium external to the cryogenic vessel.

16. The system according to claim 13, wherein the magnet is annular and is disposed with its axis vertical within a vertical cryogenic vessel.

17. The system according to claim 16, wherein the valve is connected to an outer chamber containing liquid helium at a temperature of about 4.2 K, the outer chamber surrounding the inner chamber and being contained within the cryogenic vessel.

18. The system according to claim 17, wherein a gas-cooled shield is provided within the vessel so as to surround the inner chamber.

19. The system according to claim 18, wherein an annular liquid nitrogen reservoir is provided within the vessel so as to surround the inner chamber.

20. A method of maintaining cryogenic cooling of a superconducting magnet surrounded by liquid helium at a temperature of below 4.2 K within an inner chamber of a cryogenic vessel, said magnet being annular disposed with its axis horizontal within a horizontal cryogenic vessel, the method comprising:

at intervals, cooling the liquid helium to the temperature below 4.2 K by pumping the inner chamber to a pressure below atmospheric pressure, supplying current to the magnet by way of a removable current lead extending through a supply passage passing through the wall of the vessel in order to initiate superconducting current flow in the magnet;

stopping the supply of current to the magnet whilst the superconducting current flow persists in the magnet;

withdrawing the current lead from the supply passage;

after an extended period of superconducting current flow in the magnet without stopping such superconducting current flow, ascertaining the need to supply liquid helium at a temperature of about 4.2 K to the upper part of the inner chamber when the level of the liquid helium in the inner chamber has fallen below a predetermined level;

stopping the pumping of the inner chamber and allowing the pressure of the inner chamber to increase to atmospheric pressure;

supplying from a source external to the cryogenic vessel, by way of a valve, liquid helium at a temperature of about 4.2 K to an upper part of the inner chamber above the magnet such that the magnet is still surrounded by liquid helium at a temperature of below 4.2 K;

stopping the supply of liquid helium to the inner chamber by closing the valve; and cooling the liquid helium in the upper part of the inner chamber to a temperature of below 4.2 K by reducing the pressure in the upper part of the inner chamber by pumping whilst the valve remains closed, whereby the flow of liquid helium from the outer chamber to the upper part of the inner chamber occurs as a result of the reduced pressure upon opening of said valve.

* * * * *